United States Patent
Tsai et al.

(10) Patent No.: US 9,337,269 B2
(45) Date of Patent: May 10, 2016

(54) BURIED-CHANNEL FINFET DEVICE AND METHOD

(71) Applicant: Taiwan Semiconductor Manufacturing Company, Ltd., Hsin-Chu (TW)

(72) Inventors: Fu-Huan Tsai, Tainan (TW); Chia-Chung Chen, Keelung (TW); Feng Yuan, Yonghe (TW); Chi-Feng Huang, Zhubei (TW); Victor Chiang Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 57 days.

(21) Appl. No.: 14/178,053

(22) Filed: Feb. 11, 2014

(65) Prior Publication Data

US 2015/0228725 A1     Aug. 13, 2015

(51) Int. Cl.
| H01L 29/76 | (2006.01) |
| H01L 29/94 | (2006.01) |
| H01L 29/10 | (2006.01) |
| H01L 29/78 | (2006.01) |
| H01L 29/66 | (2006.01) |

(52) U.S. Cl.
CPC ...... *H01L 29/1041* (2013.01); *H01L 29/66795* (2013.01); *H01L 29/785* (2013.01)

(58) Field of Classification Search
CPC ............ H01L 27/0886; H01L 27/0924; H01L 27/10826; H01L 27/10879; H01L 27/1211; H01L 29/785
USPC .............. 257/192, E27.059, E27.06, E51.006
See application file for complete search history.

(56) References Cited

U.S. PATENT DOCUMENTS

| 7,910,413 B2 | 3/2011 | Zhu |
| 2006/0197129 A1 | 9/2006 | Wohlmuth |
| 2015/0187634 A1* | 7/2015 | Chiang et al. ..... H01L 21/76224 |

\* cited by examiner

*Primary Examiner* — Hoai V Pham
(74) *Attorney, Agent, or Firm* — Slater & Matsil, L.L.P.

(57) ABSTRACT

A fin field effect transistor (FinFET), and a method of fabrication, is introduced. In an embodiment, trenches are formed in a substrate, wherein a region between adjacent trenches defines a fin. A dielectric material is formed in the trenches. The fins are doped to form source, drain and buried channel regions. A gate stack is formed over the buried channel regions. Contacts are formed to provide electrical contacts to the source/drain regions and the gate.

20 Claims, 6 Drawing Sheets

BURIED-CHANNEL FINFET DEVICE AND METHOD

BACKGROUND

Semiconductor manufacturers face a constant challenge to comply with Moore's Law. They constantly strive to continually decrease feature sizes, such as active and passive devices, interconnecting wire widths and thicknesses and power consumption as well as increase device density, wire density and operating frequencies.

As the semiconductor devices are getting smaller, they show degradation in performance. For example, planar metal-oxide-semiconductor field effect (MOSFET) transistor gates do not have abilities to adequately control channels. In addition, reduction in size leads to lower currents in the channels, leakage currents, and short channel effects to name a few.

The semiconductor industry came up with a solution to move away from the planar structures and introduce three dimensional (3D) features. For example, channels have a form of a 3D bar or a similar 3D structure, which is usually referred as a "fin" in the so called FinFET transistors. The 3D channel can be controlled from more than one side, which leads to an improvement in device functionality. Moreover, the FinFET transistors have higher drain currents, have higher switching speeds, lower switching voltages, less leakage currents, and consume less power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-4B are top and cross sectional views illustrating a semiconductor device fabrication process in accordance with some embodiments;

DETAILED DESCRIPTION OF ILLUSTRATIVE EMBODIMENTS

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is presented in terms of forming a fin field effect transistor (FinFET) with a buried channel. As will be described in detail below, channel regions of fins are inhomogeneously doped to displace channels away from fin walls. Current carriers moving along the buried channels do not encounter imperfections at the fin walls, which reduces device noise. The noise is usually a colored noise and its power spectrum depends on frequency f as 1/f. By suitably adjusting device parameters, performance enhancements are achieved, such as low 1/f flicker noise. In what follows, a fabrication method of an NMOS FinFET device will be described as an example. However, it will be apparent to persons skilled in the art that similar fabrication method may be used to form a PMOS FinFET device.

Figure 1A:
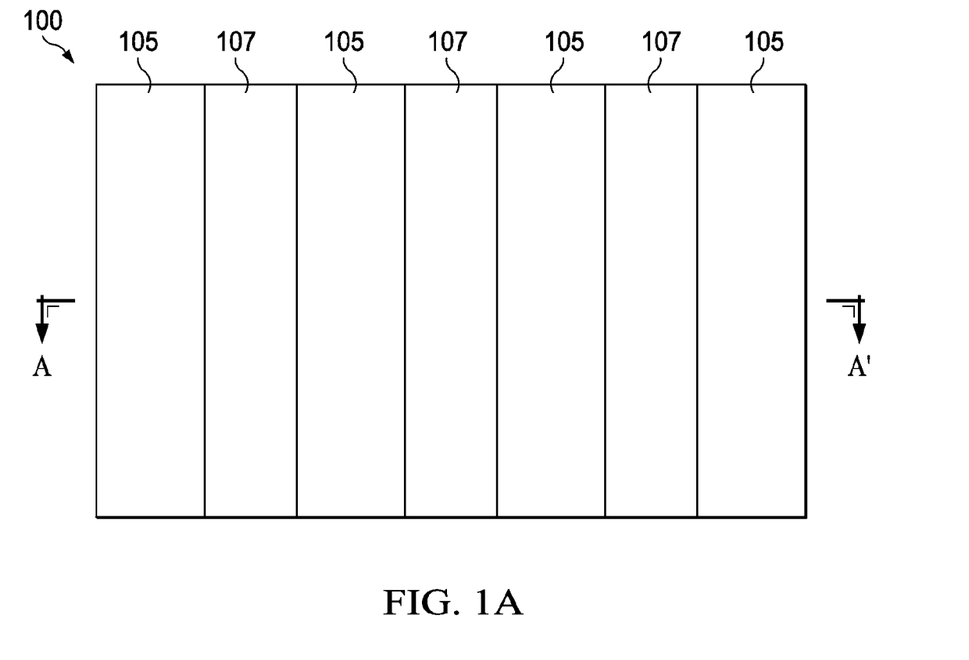

FIGS. 1A-5 illustrate various intermediate stages of a method of forming a semiconductor device 100 in accordance with some embodiments. With reference to FIGS. 1A and 1B, there are shown top and cross-sectional views (through the line AA' in FIG. 1A), respectively, of the semiconductor device 100. The semiconductor device 100 may include a substrate 101 having fins 103 extending therefrom, and shallow trench isolation (STI) regions 105 on top of the substrate 101 between the fins 103. In some embodiments, the substrate 101 comprises a crystalline silicon substrate (e.g., wafer), doped or undoped. In other embodiments, the substrate 101 may be made of some other suitable semiconductors, such as gallium arsenide, silicon carbide, indium arsenide, indium phosphide, silicon germanium carbide, gallium arsenic phosphide, or gallium indium phosphide. Further, the substrate 101 may include a strained epitaxial layer for performance enhancement. For example, in some embodiments all or a portion of the fins 103 may be replaced with an epitaxial material having a different lattice structure than the substrate 101 such that a stress may be applied to a channel region for improved performance. In yet other embodiments, the substrate 101 may be a silicon-on-insulator (SOI) structure.

Figure 1B:
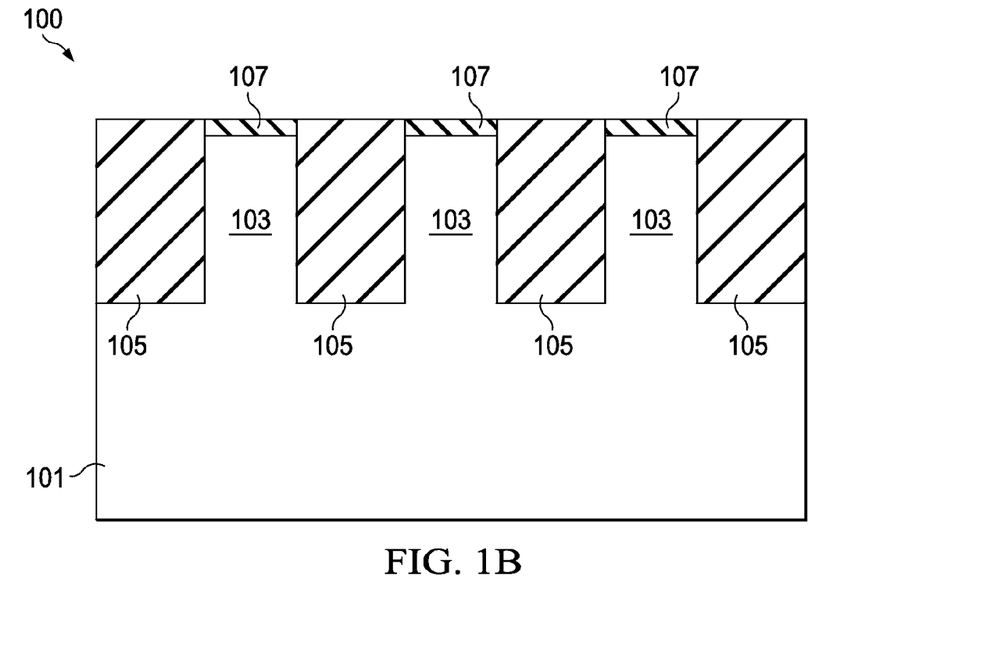

In an embodiment, the substrate 101 may comprise a p-doped silicon, doped using, for example, boron or other suitable acceptor dopants to form a body of an NMOS FinFET device. In an embodiment, the substrate 101 has a dopant concentration of between about $1E15$ $cm^{-3}$ and about $1E16$ $cm^{-3}$. In other embodiments, suitable dopants may be selected to form a PMOS device.

The substrate 101 may be patterned to form the fins 103 using, for example, photolithography techniques. Generally, a photoresist material (not shown) is deposited, irradiated (exposed), and developed to remove a portion of the photoresist material. The remaining photoresist material protects the underlying material from subsequent processing steps, such as etching. In this example, the photoresist material is used to form a patterned mask (not shown) to protect sections of the substrate 101 while etching trenches in the substrate, thereby defining the fins 103. Subsequently, the photoresist material is removed using, for example, an ashing process in combination with a wet clean process.

In some embodiments, it may be desirable to use an additional mask layer. During the etching process to pattern the substrate 101, portions of the patterned photoresist material may also be removed. In some instances, the entire photoresist material may be removed prior to the completion of the etching process to form the fins 103. In these situations, the additional mask, such as a hard mask, may be used. For example, a hard mask layer 107 may comprise one or more layers of silicon oxide, silicon nitride (SiN), silicon oxynitride (SiON), tetraethyl orthosilicate (TEOS), or the like. For example, in some embodiments, the hard mask layer 107 comprises a multilayer structure of a SiN layer, a TEOS layer, and a SiON layer.

The substrate 101 is etched to remove exposed portions of the substrate 101 to form trenches in the substrate 101, wherein portions of the substrate 101 between adjacent trenches form the fins 103. The substrate 101 is etched, for example, by an anisotropic wet etch process or an anisotropic dry etch process. In an embodiment, the anisotropic wet etch may be performed on the substrate 101 comprising silicon using potassium hydroxide (KOH), ethylenediamine pyrocatechol (EDP), tetramethylammonium hydroxide (TMAH), or similar. The anisotropic dry etch process may include physical dry etching, chemical dry etching, reactive ion etching, or similar. In an embodiment, the ions that are used in chemical dry etching of silicon are tetrafluoromethane ($CF_4$), sulfur hexafluoride ($SF_6$), nitrogen trifluoride ($NF_3$), chlorine gas ($Cl_2$), or fluorine ($F_2$). The typical reactive ion etching gasses for silicon are $CF_4$, $SF_6$ and $BCl_2+Cl_2$. In some embodiments, when viewed from above, the trenches may be strips parallel to each other, and closely spaced with respect to each other, as illustrated in FIG. 1A. In some embodiments, the trenches may be continuous and surrounding the fins 103. In other embodiments, the fins 103 may be formed using a suitable multiple pattering method such as, for example, the sidewall image transfer (SIT) process. In an embodiment, the fins 103 may have a height between about 30 nm to about 40 nm and a width between about 6 nm to about 14 nm.

In some embodiments, liner oxide layer (not shown) such as silicon dioxide, or similar may be formed in the trenches between the adjacent fins 103, for example, by thermal oxidation process. Subsequently, the trenches are filled with a dielectric material to form the STI regions 105. The STI regions 105 may comprise silicon oxide, silicon nitride, fluoride-doped silicate glass (FSG), or a low-K dielectric material, may also be used. In some embodiments, the STI regions 105 may be formed using a high-density-plasma (HDP) CVD process, using silane ($SiH_4$) and oxygen ($O_2$) as reacting precursors. In other embodiments, the STI regions 105 may be formed using a sub-atmospheric CVD (SACVD) process or high aspect-ratio process (HARP), wherein process gases may comprise tetraethylorthosilicate (TEOS) and ozone ($O_3$). In yet other embodiments, the STI regions 105 may be formed using a spin-on-dielectric (SOD) process, such as hydrogen silsesquioxane (HSQ) or methyl silsesquioxane (MSQ). Other processes and materials may be used. A chemical mechanical planarization (CMP) may be performed to remove excess portion of the dielectric material forming the STI layer 105 as illustrated in FIG. 1B. The hard mask layer 107 may act as a planarization stop layer during the CMP process.

Figure 2A:
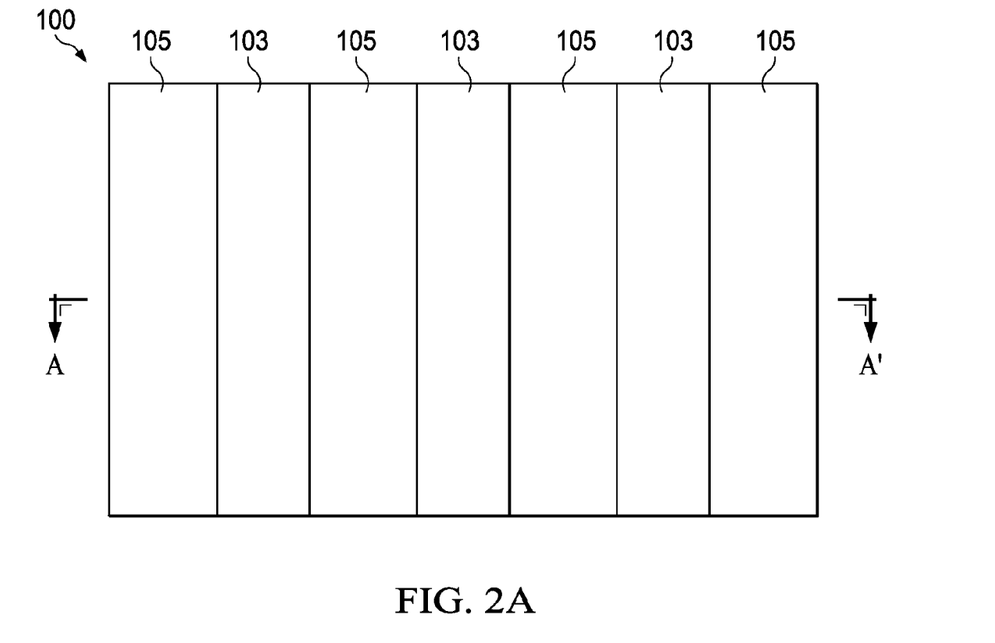
Figure 2B:
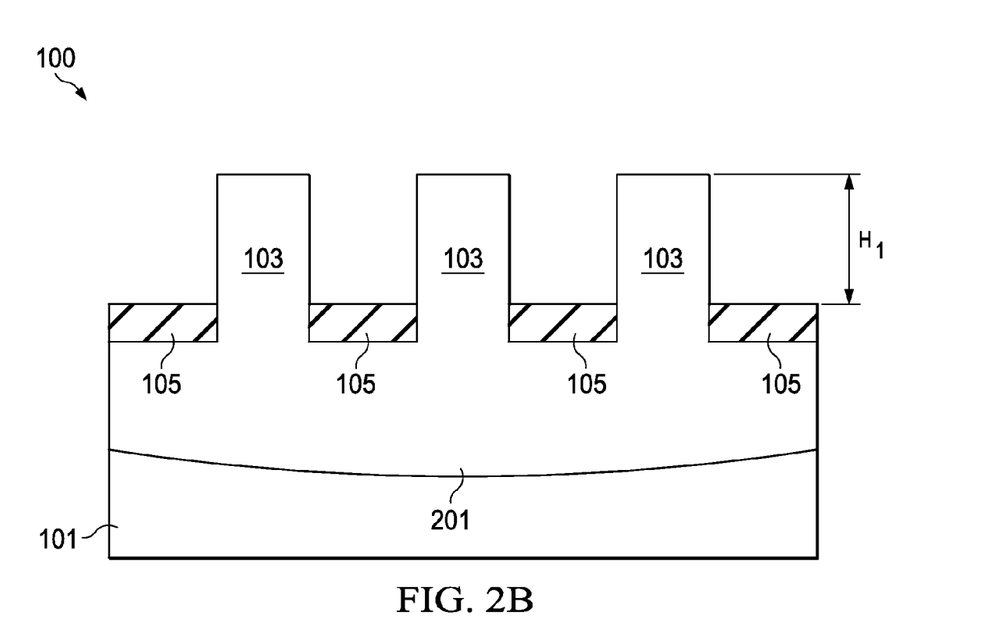

In reference to FIGS. 2A and 2B, the STI regions 105 are recessed, for example, by a selective wet etch or a selective dry etch process to expose portions of the fins 103. In an embodiment, the hard mask layer 107 may be used to aid in etching of the STI regions 105 to expose the fins 103. The STI regions 105 may be etched, for example, by anisotropic dry etch processes or an anisotropic wet etch processes discussed above to remove exposed portions the STI regions 105. For example, the STI regions 105 may be recessed using a reactive ion etching process with sulfur hexafluoride ($SF_6$) plasma. In another embodiment, the STI regions 105 may be recessed by blanket wet etch process using HF acid, or the like. Subsequently, the hard mask layer 107 may be removed, for example, by dipping in hot phosphoric acid, buffered HF solution, or similar. In an embodiment, the STI regions 105 may be recessed to a first depth $H_1$ between about 15 nm and about 20 nm.

In further reference to FIG. 2B, a $p^+$-well 201 is formed in the substrate 101. In an embodiment, a capping oxide layer (not shown) may be formed over the semiconductor device 100, for example, using the thermal oxidation process to protect the semiconductor device 100 from the subsequent doping process. In an embodiment, the capping oxide layer may be formed to a first thickness between about 8 nm and about 15 nm. The $p^+$-well 201 may be formed by ion implantation using, for example, boron dopants, or other suitable acceptor dopants. In an embodiment, a dose of boron atoms is between about $5E10$ $cm^{-2}$ and about $1E11$ $cm^{-2}$, and the $p^+$-well 201 is formed with a dopant concentration between about $1E16$ $cm^{-3}$ and about $3E16$ $cm^{-3}$.

Figure 3A:
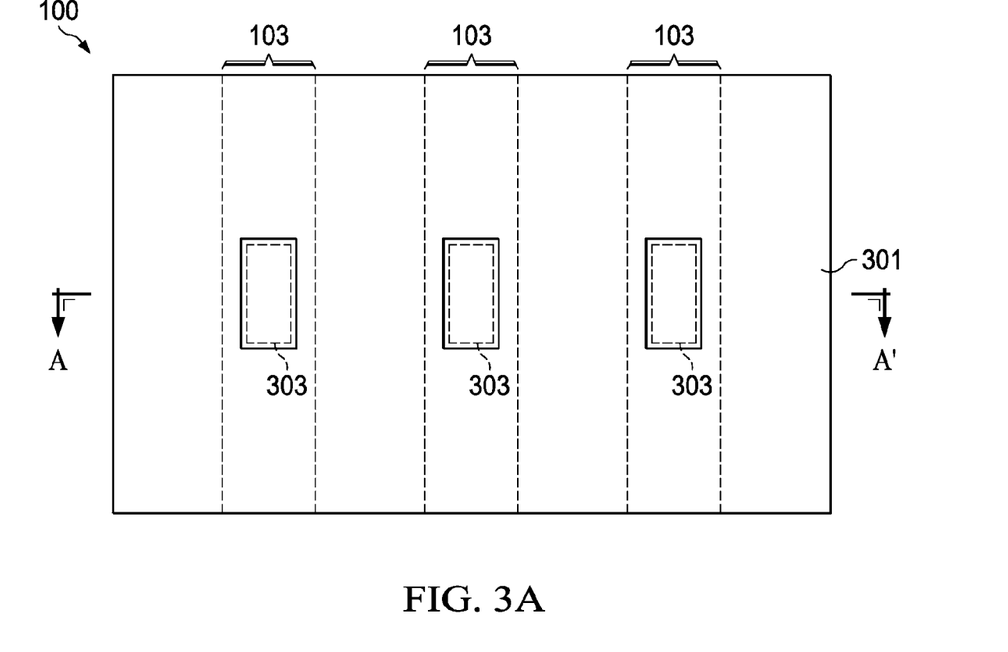
Figure 3B:
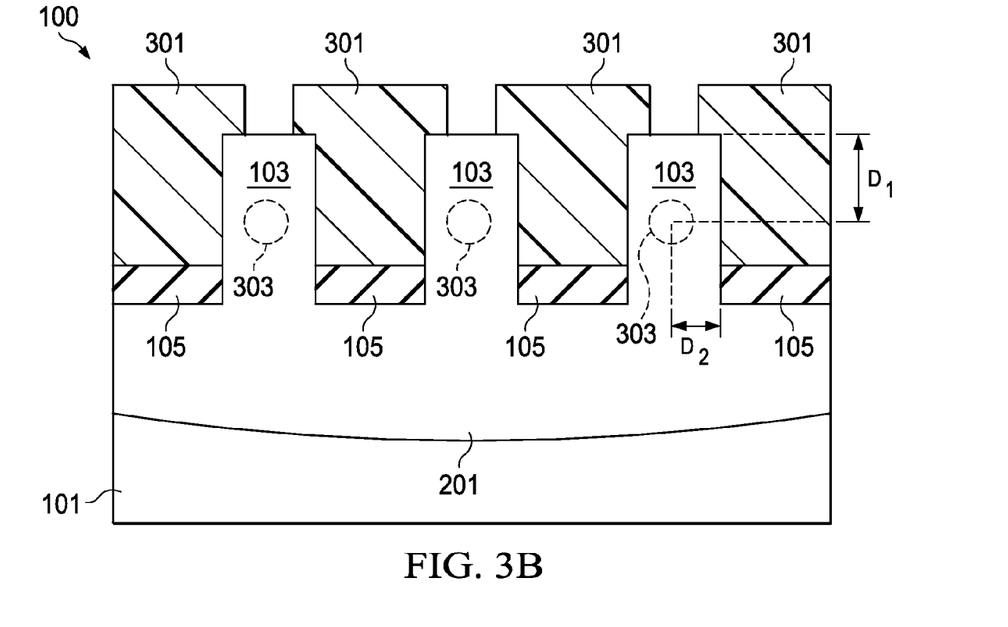

In reference to FIGS. 3A and 3B, a patterned photoresist layer 301 is formed over the substrate 101 and the fins 103 to aid in further doping of the semiconductor device 100. A photoresist material is deposited, irradiated (exposed), and developed to remove a portion of the photoresist material and form the patterned photoresist layer 301. The fins 103 are inhomogeneously doped to form buried channels as well as modify a threshold voltage $V_t$ of the semiconductor device 100. In an embodiment, the fins 103 are doped by ion implantation using phosphorus, arsenic, or other suitable donor dopants to form the buried channel in an NMOS FinFET device. In another embodiment, the fins 103 are doped by ion implantation using boron, or other suitable acceptor dopants to form the buried channel in a PMOS FinFET device. In an embodiment, energy of phosphorus ions is between about 10 KeV to about 30 KeV, and a dose is between about $1E13$ $cm^{-2}$ and about $5E13$ $cm^{-2}$. In another embodiment, energy of boron ions is between about 10 KeV to about 30 KeV, and a dose is between about $1E13$ $cm^{-2}$ and about $5E13$ $cm^{-2}$.

In further reference to FIG. 3B, buried channel regions 303 are formed in the interior of the fins 103 away from the surfaces of the fins 103 by the inhomogeneous doping process described above. The buried channel regions 303 are formed in regions of the fins 103 below a gate, and between source and drain regions that are subsequently formed, as will be discussed in great detail below. Centers of the buried channel regions 303, which are locations of maximum dopant concentrations, are located near centers of the fins 103 at a first distance $D_1$ from top surfaces of the fins 103 and a top surface of the substrate 101, at a second distance $D_2$ from right and left sidewalls of the fins 103, and at equal distances between the source regions and drain regions along a longitudinal axis of the fins 103. The first distance $D_1$ may be between about 15 nm and about 20 nm, and the second distance $D_2$ may be between about 3 nm and about 7 nm. In an embodiment, the buried channel regions 303 may have maximum dopant concentrations between about $3E19$ $cm^{-3}$ and about $4E20$ $cm^{-3}$. In an embodiment, doping profiles in the buried channel regions 303 may have shapes of Gaussian distributions along directions perpendicular to the longitudinal axis of the fins 103, with centers at the centers of the fins 103. In an embodiment, standard deviations of the Gaussian distributions are between about 1.8 nm and about 4.2 nm.

Figure 4A:
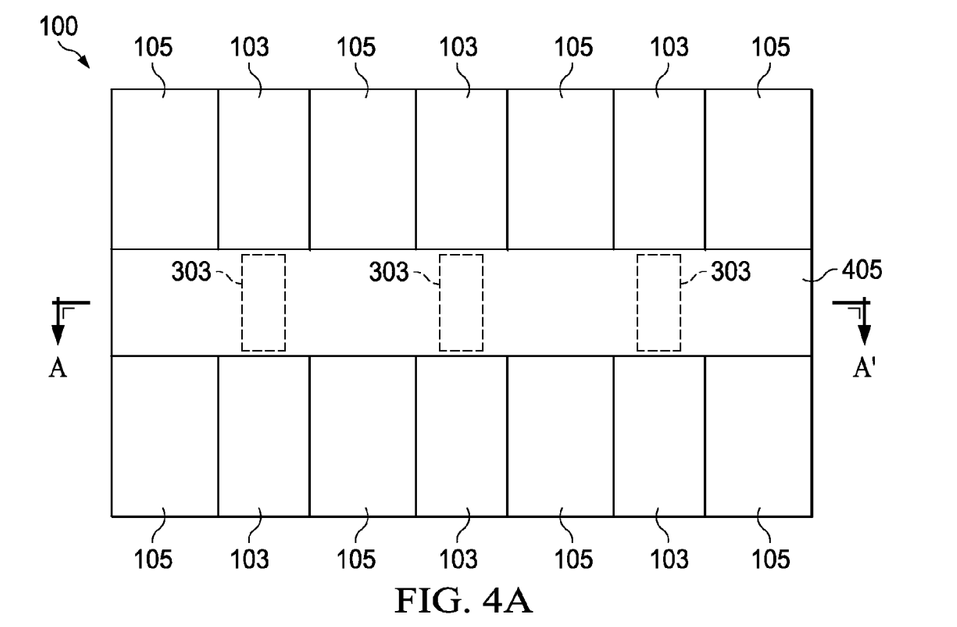
Figure 4B:
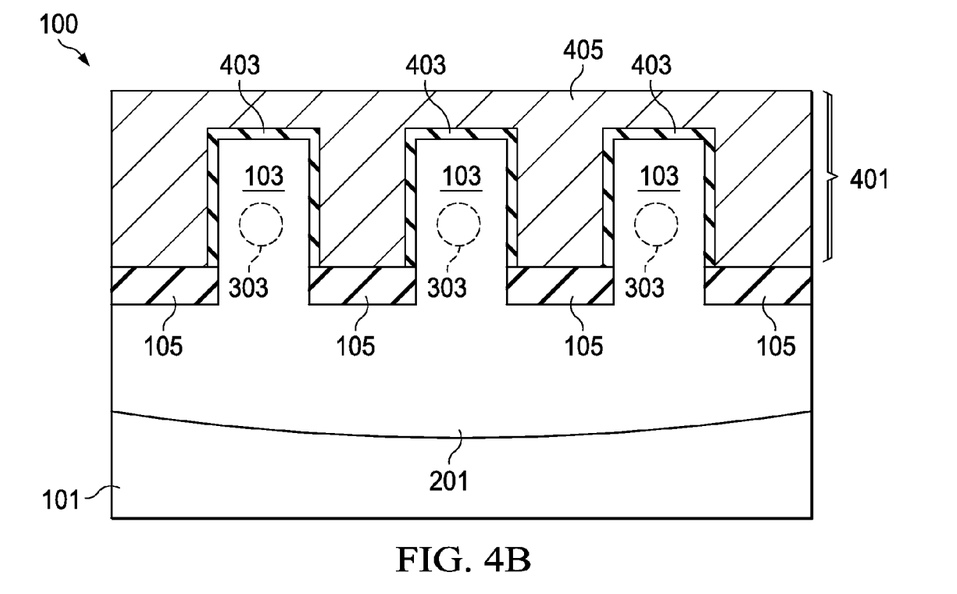

FIGS. 4A and 4B illustrate a gate stack 401 formed over the fins 103. For example, the gate stack 401 may be formed by depositing a gate dielectric layer and a gate conductive layer over the fins 103 by CVD, physical vapor deposition (PVD), atomic layer deposition (ALD), other suitable methods, and/or combinations thereof. A photolithography patterning process, including depositing a photoresist material, exposing according to a desired pattern, and developing, is used to pattern the gate dielectric layer and the gate conductive layer to form a gate dielectric 403 and a gate electrode 405 of the gate stack 401, as illustrated in FIG. 4B. The etching processes may include, for example, dry etching, wet etching, and/or other etching methods (e.g., reactive ion etching). The gate dielectric layer may include any suitable material, such as silicon oxide, silicon nitride, or a high-k dielectric material. The gate conductive layer may include highly doped polysilicon, a metallic material, or any suitable conductive material. In an embodiment, the gate dielectric 403 may have a thickness of between about 15 nm and about 30 nm, and the gate electrode 405 may have a thickness of between about 100 nm and about 300 nm.

In some embodiments, optional spacers (not shown) may be formed alongside the gate stack 401. The spacers may include one or more layers of a dielectric material such as silicon oxide, silicon nitride, silicon carbide, silicon oxynitride, or combinations thereof. The spacers may be formed by, for example, depositing a dielectric material over the gate structure and anisotropically etching the dielectric material.

Figure 5:
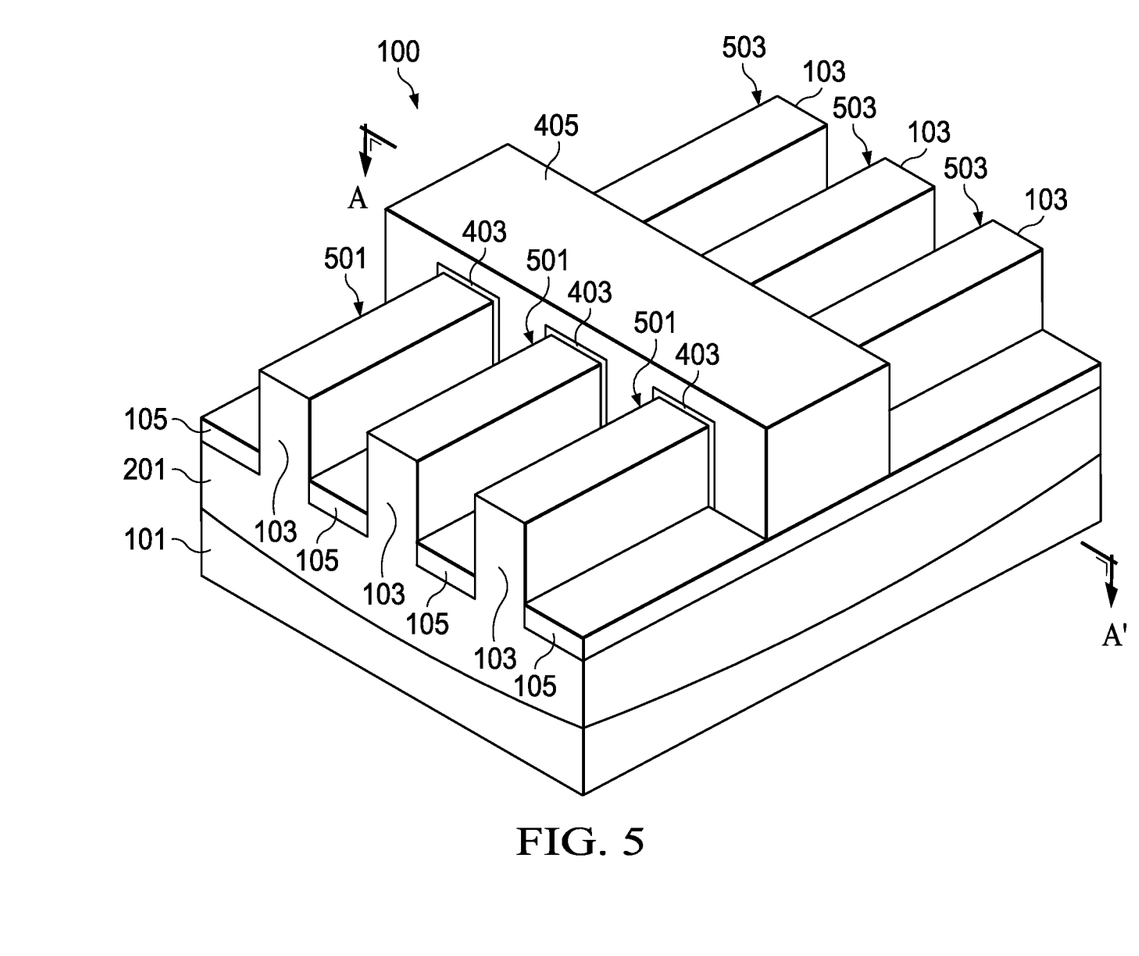
FIG. 5 is a three-dimensional view illustrating a semiconductor device fabrication process in accordance with some embodiments.

In reference to FIG. 5, source regions 501 and drain regions 503 are formed by doping the fins 103 on either sides of the gate stack 401. In some embodiments, the source regions 501 and the drain regions 503 may be doped by ion implantation method. For example, the source regions 501 and the drain regions 503 may be doped with n-type dopants, e.g., phosphorous or the like, to form an NMOS device, or p-type dopants, e.g., boron or the like, to form a PMOS device. In an embodiment, a dose of phosphorus ions may be between about 5E14 $cm^{-2}$ and about 1E15 $cm^{-2}$, and the source regions 501 and the drain regions 503 may have dopant concentrations between about 1E22 $cm^{-3}$ and about 3E22 $cm^{-3}$. Multiple doping processes may be utilized to create a desired doping profile, including, for example, lightly-doped drain (LDD) regions (not shown) and the like. In some embodiments, dopant profiles may have Gaussian shapes in the source regions 501 and the drain regions 503. In an embodiment, regions of maximum concentration in the source regions 501 and the drain regions 503 are located above the centers of the buried channel regions 303.

In some embodiments, an optional stress-inducing material (not shown) may be formed in the source regions 501 and the drain regions 503 along opposing sides of the gate stack 401. Generally, an epitaxial material having a different lattice constant may be formed over the fins 103 or may replace a portion of the fins 103. The different lattice constants of the materials of the substrate 101 and the epitaxial material may induce a strain within the channel region, thereby increasing device performance. For example, in embodiments in which the substrate 101 is silicon, the epitaxial material may be Ge, SiC, GaAs, AlGaAs, SiGe, GaAsP, or other suitable material. In another example, the epitaxial material may be SiC to induce a stress in the channel and enhance performance of the NMOS FinFET device, and the epitaxial material may be SiGe to induce a stress in the channel and enhance performance of a PMOS FinFET device. In yet other embodiments, multiple epitaxial layers may be used.

In some embodiment, portions of the fins 103 may be removed and replaced with the stress-inducing material. For example, the STI regions 105 may act as a mask for a selective etch process to etch exposed portions of the fins 103. In some embodiments, the etching process may be performed using a chemical selected from $Cl_2$, HBr, $NF_3$, $CF_4$, and $SF_6$ as an etching gas. In some embodiments, portions of the STI regions 105 may also be recessed to form, for example, a common source/drain trench. A suitable semiconductor material may be epitaxially grown in recesses to form the source regions 501 and the drain regions 503. The source regions 501 and the drain regions 503 may be in-situ doped during the epitaxial process and/or one or more subsequent doping process, e.g., an implant, may be performed. For example, epitaxially grown silicon source/drain regions may be doped with n-type dopants, e.g., phosphorous or the like, to form an NMOS device, or p-type dopants, e.g., boron or the like, to form a PMOS device.

Further manufacturing steps may be performed on the semiconductor device 100. For example, an interlayer dielectric (ILD) layer (not shown) may be deposited over the source regions 501, the drain regions 503, the gate stack 401. The ILD layer is formed of one or more layers of dielectric material, such as silicon oxide, oxynitride, low-k dielectrics or other suitable materials, by a suitable technique, such as CVD, ALD, and spin-on (SOG). A CMP process may be performed to remove excessive dielectric material from the ILD layer.

Subsequently, contacts (not shown) are formed to provide electrical contacts to the source regions 501, the drain regions 503, and the gate stack 401. The ILD layer may be patterned using photolithography techniques to form trenches and vias. The contacts are formed by depositing a suitable material in the trenches and the vias of the ILD layer using various deposition and plating methods, or similar. In addition, the contacts may include one or more barrier/adhesion layers (not shown) to protect the ILD layer from diffusion and metallic poisoning. The barrier layer may comprise titanium, titanium nitride, tantalum, tantalum nitride, or other alternatives. The barrier layer may be formed using PVD, CVD, or the like.

The material of the contacts may comprise copper, a copper alloy, silver, gold, tungsten, tantalum, aluminum, and the like. In an embodiment, the steps for forming the barrier layer and the contacts may include blanket forming barrier layer, depositing a thin seed layer of a conductive material, and filling the trenches and the vias in the ILD layer with the conductive material, for example, by plating. A CMP is then performed to remove excess barrier layer and the conductive material.

Figure 6:
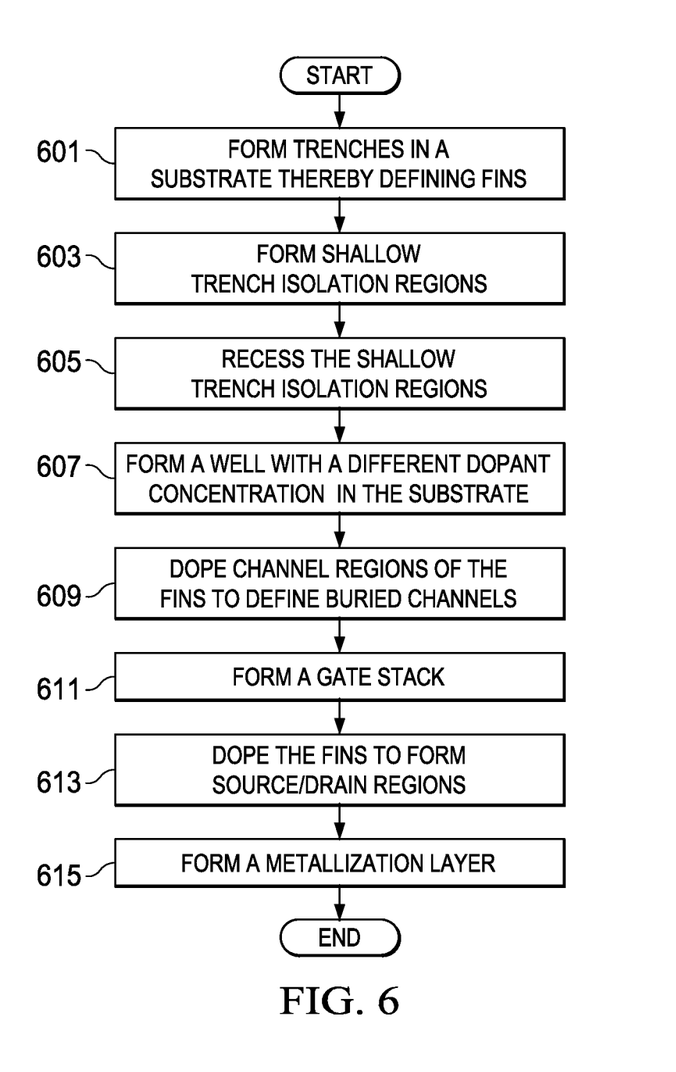
FIG. 6 is a flowchart illustrating a semiconductor device fabrication method in accordance with some embodiments.

FIG. 6 is a flowchart illustrating a method that may be performed to manufacture a semiconductor device in accordance with an embodiment. The method begins at step 601, wherein trenches are formed in a substrate, such as that discussed above with reference to FIGS. 1A and 1B. Adjacent trenches define a fin interposed between the trenches. In step 603, shallow trench isolation regions are formed over the substrate and between the fins by depositing a dielectric material in the trenches and performing a chemical mechanical planarization to remove excess dielectric material. The shallow trench isolation regions are recessed and portions of the fins are exposed in step 605 as discussed above with reference to FIGS. 2A and 2B. Subsequently, the substrate is doped in step 607 to define a well of a different dopant concentration in the substrate, as discussed above with reference to FIG. 2B.

In step 609, channel regions of the fins are doped to form buried channels, as discussed above with reference to FIGS. 3A and 3B. Thereafter, in step 611, a gate stack is formed, such as that discussed above with reference to FIGS. 4A and 4B. The fins are doped in step 613 to form source/drain regions, such as those discussed above with reference to FIG. 5. Finally, in the step 615, a metallization layer is formed, such as that discussed above. The metallization layer may comprise an interlayer dielectric layer, with contacts embedded in the interlayer dielectric layer to provide electrical contacts to the source/gate regions and the gate.

In an embodiment, the semiconductor device 100 may have a channel formed to a length L of about 16 nm, an off-state current $I_{off}$ of about 6.34E-07 A, the threshold voltage $V_t$ of about 0.2 V, and a saturation current $I_{sat}$ of about 5.28E-0.5 A. In another embodiment, the semiconductor device 100 may have the channel formed to the length L of about 25 nm, an off-state current $I_{off}$ of about 2.45E-09 A, the threshold voltage $V_t$ of about 0.3 V, and a saturation current $I_{sat}$ of about 3.89E-0.5 A.

In an embodiment, the channels may be further displaced by applying a gate voltage $V_g$ to the gate stack 401. For the gate voltage $V_g$ between about $V_t$ to about $V_t$+0.2V the channels remain buried, current density is maximized at the centers of the fins 103, and the current mainly flows near the centers of the fins 103 and away from the surfaces of the fins 103. In this regime, the semiconductor device 100 exhibits low flicker noise level. In another embodiment, with gate voltage $V_g$ about the same as a drain voltage $V_{dd}$, the channels shift to the surfaces of the fins 103, current density is maximized at the surfaces of the fins 103, and the current mainly flows near the surfaces of the fins 103. In this regime, the semiconductor device 100 exhibits high flicker noise level.

In an embodiment, a semiconductor device comprises a substrate of a first conductivity type, the substrate having a fin extending therefrom. The semiconductor device further comprises a first source/drain region in the fin, the first source/drain region having dopants of a second conductivity type, a second source/drain region in the fin, the second source/drain region having dopants of the second conductivity type, and a buried channel region in the fin between the first source/drain region and the second source/drain region, the buried channel region having dopants of the second conductivity type.

In another embodiment, a semiconductor device comprises a substrate of a first conductivity type, the substrate having a plurality of trenches and fins interposed between adjacent trenches, and shallow trench isolation (STI) regions on the substrate between adjacent fins, wherein each of the fins has a source region, a drain region, and a buried channel region interposed between the source region and the drain region, each of the source regions, the drain regions, and the buried channel regions of each of the fins having dopants of a second conductivity type.

In yet another embodiment, a method for manufacturing a semiconductor device, the method comprises providing a substrate of a first conductivity type, the substrate having one or more fins extending therefrom, and performing a first doping of the one or more fins with dopants of a second conductivity type, thereby forming a buried channel region in each of the fins. The method further comprises performing a second doping of the one or more fins with dopants of the second conductivity type, thereby forming source/drain regions in each of the fins, and forming a gate over each of the buried channel regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate of a first conductivity type, the substrate having a fin extending therefrom;
    a first source/drain region in the fin, the first source/drain region having dopants of a second conductivity type;
    a second source/drain region in the fin, the second source/drain region having dopants of the second conductivity type; and
    a buried channel region in the fin between the first source/drain region and the second source/drain region, the buried channel region having dopants of the second conductivity type.

2. The semiconductor device of claim 1, further comprising a well in the substrate under the fin, the well being of the first conductivity type.

3. The semiconductor device of claim 1, wherein a maximum concentration of dopants of the second conductivity type in the buried channel region is located at a center of the buried channel region.

4. The semiconductor device of claim 1, wherein a maximum concentration of dopants of the second conductivity type in the buried channel region is between about 3E19 cm$^{-3}$ and about 4E20 cm$^{-3}$.

5. The semiconductor device of claim 1, wherein a center of the buried channel region is located at a first distance from a top surface of the fin and a second distance from a sidewall of the fin, the first distance being between about 15 nm and about 20 nm and the second distance being between about 3 nm and about 7 nm.

6. The semiconductor device of claim 1, wherein a maximum concentration of dopants of the second conductivity type in the first source/drain region and the second source/drain region is between about 1E22 cm$^{-3}$ and about 3E22 cm$^{-3}$.

7. The semiconductor device of claim 1, wherein regions of a maximum concentration of dopants of the second conductivity type in the first source/drain region and the second source/drain region are located higher than a center of the buried channel region.

8. The semiconductor device of claim 1, wherein a current density has a maximum value in an interior of the buried channel region for a gate voltage between about $V_t$ and about $V_t$+0.2V.

9. A semiconductor device comprising:
    a substrate of a first conductivity type, the substrate having a plurality of trenches and fins interposed between adjacent trenches; and
    shallow trench isolation (STI) regions on the substrate between adjacent fins, wherein each of the fins has a source region, a drain region, and a buried channel region interposed between the source region and the drain region, each of the source regions, the drain regions, and the buried channel regions of each of the fins having dopants of a second conductivity type.

10. The semiconductor device of claim 9, further comprising a well in the substrate below the fins, the well being of the first conductivity type, wherein a first concentration of dopants of the first conductivity type in the well is greater than a second concentration of dopants of the first conductivity type in the substrate below the well.

11. The semiconductor device of claim 9, wherein regions of a maximum concentration of dopants of the second conductivity type in the source regions and the drain regions are located higher than a center of the buried channel region.

12. The semiconductor device of claim 9, wherein a maximum concentration of dopants of the second conductivity type in the buried channel regions is between about 3E19 cm$^{-3}$ and about 4E20 cm$^{-3}$.

13. The semiconductor device of claim 9, wherein a maximum concentration of dopants of the second conductivity type in the buried channel regions is located at centers of the buried channel regions.

14. The semiconductor device of claim 9, wherein the buried channel regions have a first dopant concentration, and the source regions and the drain regions have a second dopant concentration, the second dopant concentration being greater than the first dopant concentration.

15. A semiconductor device comprising:
a substrate of a first conductivity type, the substrate having a fin extending therefrom;
a gate stack over a middle portion of the fin;
a buried channel region in the fin below the gate stack, the buried channel region having dopants of a second conductivity type, the buried channel region being disposed away from sidewalls of the fin;
a first source/drain region in a first end of the fin, the first source/drain region having dopants of the second conductivity type; and
a second source/drain region in a second end of the fin, the second source/drain region having dopants of the second conductivity type.

16. The semiconductor device of claim 15, further comprising a shallow trench isolation (STI) region along a sidewall of the fin.

17. The semiconductor device of claim 15, wherein a current density has a maximum value in an interior of the buried channel region for a gate voltage between about $V_t$ and about $V_t+0.2V$.

18. The semiconductor device of claim 15, wherein the buried channel region has a first dopant concentration, and the first source/drain region and the second source/drain region have a second dopant concentration, the second dopant concentration being greater than the first dopant concentration.

19. The semiconductor device of claim 15, wherein a maximum concentration of dopants of the second conductivity type in the buried channel region is located at a center of the buried channel region.

20. The semiconductor device of claim 15, wherein regions of a maximum concentration of dopants of the second conductivity type in the first source/drain region and the second source/drain region are located higher than a center of the buried channel region.

* * * * *